| (12) | United States Patent | (10) Patent No.: | US 7,227,078 B2 |
|---|---|---|---|
| | Jongerden et al. | (45) Date of Patent: | Jun. 5, 2007 |

(54) COLORED SOLAR CELL UNIT

(75) Inventors: Gert Jan Jongerden, Velp (NL); Erik Middelman, Arnhem (NL); Eleonoor Van Andel, Boekelo Enschede (NL); Rudolf Emmanuel Isidore Schropp, Driebergen (NL); Paulus Marinus Gezina Maria Peters, Duiven (NL); Dinah Elisabeth Hesselink, Velp (NL)

(73) Assignee: Akzo Nobel N.V., Arnhem (NL)

( * ) Notice: Subject to any disclaimer, the term of this patent is extended or adjusted under 35 U.S.C. 154(b) by 598 days.

(21) Appl. No.: 10/363,811

(22) PCT Filed: Sep. 5, 2001

(86) PCT No.: PCT/EP01/10245

§ 371 (c)(1), (2), (4) Date: May 29, 2003

(87) PCT Pub. No.: WO02/21602

PCT Pub. Date: Mar. 14, 2002

(65) Prior Publication Data

US 2003/0178058 A1 Sep. 25, 2003

(30) Foreign Application Priority Data

Sep. 8, 2000 (NL) .................... 1016135

(51) Int. Cl.
*H01L 31/0216* (2006.01)
(52) U.S. Cl. .............. 136/256; 136/246; 438/70
(58) Field of Classification Search ........ 136/200–293; 438/70
See application file for complete search history.

(56) References Cited

U.S. PATENT DOCUMENTS

| 5,725,006 | A | * | 3/1998 | Kawama et al. ............ 136/251 |
|---|---|---|---|---|
| 5,807,440 | A | | 9/1998 | Kubota et al. ............ 136/256 |
| 6,049,035 | A | | 4/2000 | Tsuri et al. ............ 136/246 |
| 6,184,057 | B1 | | 2/2001 | Van Andel et al. ......... 438/66 |

FOREIGN PATENT DOCUMENTS

| EP | 948004 | 10/1999 |
|---|---|---|
| EP | 986109 | 3/2000 |
| JP | 0 986 109 A1 * | 3/2000 |

OTHER PUBLICATIONS

A. Schneider et al., "Development of Coloured Solar Modules for Artistic Expression with Solar Façade Designs Within the 'Bimode'—Project", 16th European Photovoltaic Solar Engery Conference, May 1-5, 2000, vol. II, pp. 1828-1831.
Abstract of JP 02094575 (1990).
Abstract of JP 08312089 (1997).
Abstract of JP 2000/188411 (2000).
Abstract of JP 10093125 (1998).
Abstract of JP 63299171 (1988).
Abstract of JP 63213978 (1988).

* cited by examiner

*Primary Examiner*—Nam Nguyen
*Assistant Examiner*—Anthony Fick
(74) *Attorney, Agent, or Firm*—Oliff & Berridge, PLC

(57) ABSTRACT

The invention pertains to a solar cell unit comprising a back electrode, a photovoltaic (PV) layer, and, optionally, a front electrode, with part of the surface of the solar cell unit not generating any energy, characterised in that on at least a portion of the part of the solar cell unit which does not generate any energy a colouring layer is present, while at least a portion of the energy generating part of the solar cell unit is free of a colouring layer. Preferably at least 50%, more preferably, at least 85%, more preferably still, at least 90% of the energy generating part of the solar cell unit is free of a colouring layer. The solar cell unit may be either a wafer-based solar cell unit or a thin film solar cell unit. The colouring layer may be applied on, e.g., the optionally present grid and/or in the case of thin film solar cell units on the part of the surface of the solar cell unit which does not generate any energy as a result of the connection in series.

The solar cell unit preferably is made by means of a process where the application of the colouring layer is integrated into the process.

The invention provides a coloured solar cell unit where the application of the colour need not be at the expense of the solar cell unit's output.

19 Claims, No Drawings

COLORED SOLAR CELL UNIT

The invention pertains to a colored solar cell unit and to a process for manufacturing the same.

Solar cell units make it possible to convert light into electricity, which offers an interesting alternative to the generation of electricity from, say, fossil fuels or nuclear power.

Solar cell units as a rule comprise one or more photovoltaic (PV) layers, e.g., composed of a semiconductor material, which is in contact with a back electrode (at the back of the unit). In the case of thin film solar cells, e.g., cells of amorphous silicon, where the stack of electrically functional layers is less than about 20 μm thick, preferably less than 10 μm, more preferably less than 5 μm thick, the front of the solar cell unit (i.e. the side of the incident light) is provided with a front electrode. The front electrode is transparent, enabling incident light to reach the semiconductor material, where the incident radiation is converted into electric energy. In the case of wafer-based solar cells, which usually are based on crystalline silicon, optionally on GaAs, the presence of a transparent front electrode generally is not necessary, since wafer-based materials have a higher conductivity than thin film materials.

The natural color of solar cell units is determined by the nature of the photovoltaic layer or layers, the nature of the front electrode if any, the nature of the anti-reflection layer if any, and, to a minor extent, the nature of the back electrode, and will generally be blue-black or reddish-brown.

When solar cell units are incorporated into buildings, it is often desired to be able to select the color impression generated by the solar cell unit or to provide a decoration on the solar cell unit, in order to be better able to integrate the solar cell units into the building's existing architectural design, or, on the other hand, to be able to use the color or design of the solar cell units for aesthetic purposes.

Various ways of providing colored solar cell units are known in the art.

The color may be obtained by providing the solar cell unit with a top layer of a transparent coloring material. Solar cell systems provided with a colored top layer are, e.g., described in U.S. Pat. No. 5,807,440, U.S. Pat. No. 6,049,035, and JP 02094575. However, using a transparent colored top layer has the drawback that its color cannot be very intense, since in that case the transparency of the top layer will be reduced to such an extent that the quantity of incident light in the solar cell unit, and hence the output, will drop to an unacceptably low level. Moreover, even the use of top layers with not very intense coloring will lead to a loss of solar cell unit output.

It is also possible to select the thicknesses of one or more layers such that the desired color is obtained by interference. Needless to say, the effective electric output of the solar cell unit will be reduced when optical interference is employed. Besides, a drawback to generating color through the thickness of the different layers may be that the thickness which is required to obtain the desired color is not necessarily similar to the best possible thickness for generating energy.

It is thus desired to have a solar cell unit which, on the one hand, enables one to select the color impression of the solar cell unit and/or decorate the solar cell unit while, on the other hand, the electrical output of the solar cell unit is not affected. The invention aims to provide such a solar cell unit.

The present invention exploits the fact that some parts of the surface of the solar cell unit do not generate any energy. By providing at least part of the non-energy-generating part of the solar cell unit with a coloring material and leaving at least part of the energy-generating part of the solar cell unit free of a coloring material, the solar cell unit is provided with a color or design while the output of the solar cell unit need not be affected.

The intention of the present invention is to change the conventional blue-black or reddish-brown color impression of the solar cell into a different color impression. Therefore, the color applied in decorating the solar cell unit should be different from the color of the solar cell unit itself. Examples of suitable colors are white, yellow, orange, pink, red, light blue, green, purple, etc. Obviously combinations of colors may also be used.

The present invention thus pertains to a solar cell unit comprising a back electrode, a photovoltaic (PV) layer, and, optionally, a front electrode, with part of the surface of the solar cell unit not generating any energy, characterized in that on at least part of the non-energy-generating part of the solar cell unit a coloring material is present, while at least part of the energy-generating part of the solar cell unit is free of a coloring material, the color of the coloring material being selected to be different from the color of the light-generating part of the solar cell unit.

It is noted that it is known in the art to provide a coating on the non-energy-generating part of a solar cell unit. This is described in EP 0 986 109, JP 08312089, and JP 08243310. However, in these references the color of the coating is selected to conform to the color of the energy-generating part of the solar cell unit to camouflage the non-energy-generating parts of the solar cell unit. This pertains to a problem different from that of the present invention, where the aim is to change the color impression generated by the solar cell unit or to provide the solar cell unit with decoration without decreasing its output.

The color difference between the light-generating part of the solar cell unit and the parts of the solar cell unit provided with a coloring material may be expressed by way of the dEab, which is defined as follows:

$$dEab=(dL^2+da^2+db^2)^{1/2}$$

wherein dL, da, and db are the differences in brightness, blueness, and redness, respectively, between the parts provided with coloring material and the light-generating parts of the solar cell unit. The L, a, and b values can be determined in accordance with the CIELAB procedure using a D65 light source. The dEab value for the solar cell system according to the invention is generally above about 10, preferably above about 12, more preferably between about 20 and 100. If more than one color is used, generally at least one of these colors will satisfy the above requirements for the dEab value.

As will be explained in more detail below, the coloring material may have the form of a separate coloring layer applied on top of the solar cell unit. However, it may also be incorporated into the structure of the non-energy-generating part of the solar cell unit. The same goes for the camouflage material to be discussed below.

As a rule, there may be two reasons for the fact that part of the active solar cell surface does not generate energy, viz. the presence of a series connection and/or the presence of a current collection grid, which for the purposes of the present specification also includes the busbars. Although both phenomena are sufficiently well known in the field, for good order's sake they will be briefly elucidated below.

The maximum voltage of a solar cell is determined by the intensity of the incident light and by the composition of the cell, more particularly by the nature of the semiconductor material. When the surface area of the solar cell is increased, more current is generated, but the voltage remains the same. In order to increase the voltage, a solar cell unit is usually divided into individual cells, which are then connected in series. In the case of wafer-based solar cell units this is done by connecting the cells by means of wiring. In the case of thin film solar cell units often a monolithic series connection is established, i.e. a series connection where the individual cells stay connected via a common carrier. A monolithic series connection generally is established by providing grooves in the different active layers and establishing a conductive contact between the front electrode of one cell and the back electrode of the other cell. The location of the series connection in the case of a monolithic series connection usually is visible to the eye as thin lines on the solar cell unit. A thin film solar cell unit will only generate energy at those locations where-the back electrode, the photovoltaic layer, and the front electrode are all present and not short-circuited. At the sites where one of the three layers is missing on account of, say, series connection, or where the layers are short-circuited, no energy is generated.

In order to improve the collection of current from the solar cell unit, solar cell units frequently are provided with a grid. In the case of wafer-based solar cell units the grid is applied on the PV layer; in the case of thin film solar cell units it is applied on the front electrode and/or, less commonly, on the back electrode if the back electrode is made of a comparatively poorly conductive TCO to obtain a (semi)transparent solar cell unit.

The grid is a pattern of lines of a conductive material which is applied in such a way as to enable an easy discharge of the current carriers generated in the electrode (electrons or "holes"). Frequently the grid is applied by means of a printing technique and in general it is silver-colored or black. At those sites where the front of the solar cell unit is covered with a grid, the incident light does not reach the photovoltaic layer, and so essentially no current is generated. For good order's sake it is noted that as a result of edge effects part of the solar cell unit beneath the grid may generate some current. Within the context of the present description the entire grid, if present, is considered to belong to the non-energy-generating part of the solar cell unit which may be provided with a coloring material.

In the case of wafer-based solar cell units the fact that part of the solar cell unit does not generate any energy usually is to be attributed to the presence of a grid. In the case of thin film solar cell units both the presence of a grid and the presence of a monolithic series connection can ensure that part of the solar cell unit will not generate any energy.

Preferably, at least 50%, more preferably, at least 85%, more preferably still, at least 90% of the energy-generating part of the solar cell unit is free of (intentionally provided) coloring material. Most preferably, the energy-generating part of the solar cell unit is essentially free of a coloring material. The term "essentially free" within the context of the present description means that the energy-generating part of the solar cell unit is free of a coloring material except for those quantities which cannot be avoided during manufacturing.

The solar cell unit according to the invention comprises a number of specific embodiments.

A first embodiment of the solar cell unit according to the invention is a wafer-based solar cell unit comprising a back electrode and a PV layer provided with a grid, where at least part of the grid is provided with a coloring material. As was indicated earlier, wafer-based solar cell units generally are connected in series by connecting the different cells by means of wiring. Although it is possible in principle to provide this wiring with a coloring material, as a rule this will not make much of a contribution to resolving the problem underlying the present invention, since, on the one hand, the wiring is often concealed at the back of the solar cell unit and, on the other, the wafers often are so large, and so give such widely spaced series connections, that providing a coloring material on them will make little contribution to the color impression of the solar cell unit as a whole. If so desired the wires may be provided with a camouflage material as will be discussed below.

A second embodiment of the solar cell unit according to the invention is a thin film solar cell unit comprising a back electrode, a PV layer, and a front electrode made of a TCO, with a grid provided on the TCO layer, where at least part of the grid is provided with a coloring material.

A third embodiment of the solar cell unit according to the invention is a thin film solar cell unit comprising a back electrode, a PV layer, and a front electrode made of a TCO, with a monolithic series connection provided on the solar cell unit, where at least part of the part of the surface of the solar cell unit which does not generate any energy as a result of the series connection is provided with a coloring material.

A fourth embodiment of the solar cell unit according to the invention is a combination of the second and third embodiments discussed above about and comprises a thin film solar cell unit comprising a back electrode, a PV layer, and a front electrode made of a TCO, with a grid provided on the TCO layer, where at least part of the grid is provided with a coloring material, and with the solar cell unit provided with a monolithic series connection, where at least part of the part of the solar cell unit which does not generate any energy as a result of the series connection is provided with a coloring material.

A fifth embodiment of the solar cell unit according to the invention is a (semi)transparent thin film solar cell unit where the back electrode is composed of a transparent conductive oxide (TCO), with the back electrode provided with a grid, where at least part of the grid is provided with a coloring material. A grid may also be present on the TCO front electrode of the (semi)transparent thin film solar cell unit, which grid may be provided at least in part with a coloring material. The solar cell unit may also be provided with a monolithic series connection, where at least part of the part of the solar cell unit which does not generate any energy as a result of the series connection may be provided with a coloring material. In that case the coloring material may be provided on either or on both sides of the solar cell unit.

How much of the non-energy-generating part of the solar cell unit is covered with a coloring material will depend on the effect aimed at, on the intensity of the color of the coloring material, the desired intensity of the color impression or decoration of the solar cell unit, the percentage of the solar cell unit which does not generate energy, and the distribution of the non-energy-generating part of the solar cell unit over the surface of the solar cell unit.

Generally, if no camouflage material as discussed below is present, at least 20% of the non-energy-generating part of the solar cell unit will be provided with a coloring material, preferably at least 50%, more preferably at least 80%.

A specific embodiment of the solar cell unit according to the invention is a solar cell unit in which part of the non-energy-generating part of the solar cell unit is provided with a coloring material, and another part of the non-energy-generating part of the solar cell unit is provided with a camouflage material. The camouflage material is a material the color of which is selected such that it is adapted to the color of the solar cell unit, this to camouflage part of the non-energy-generating part of the solar cell unit. The dEab of the camouflage material is generally below about 5, preferably below about 2, more preferably, below about 0.3. The use of a combination of a coloring material and a camouflage material makes it possible to decorate the solar cell unit with colored designs on a homogeneous background. Examples of envisaged designs are patterns, letters, figures, stripes, rectangles, and squares. In this embodiment, generally 10-90% of the non-energy-generating part of the solar cell unit is provided with a coloring material, while 90-10% of the non-energy-generating part of the solar cell unit is provided with a camouflage material. Although not essential, it is preferred in this embodiment that substantially all of the non-energy-generating part of the solar cell unit is provided either by coloring material or by camouflage material.

The various possible ways of applying the coloring material and, where applicable, the camouflage material, on the solar cell unit will be clear to the skilled person. Two general ways can be distinguished, namely applying the material as a separate layer or incorporating it in the structure of the non-energy-generating part of the solar cell unit.

If the material is to be applied as a separate layer, suitable ways include vaporizing or printing/writing. Preferably, in this case the coloring material and, where applicable, the camouflage material, are applied by means of a printing process known as such. Suitable printing processes include silk screening, inkjet processes, etc. The coloring material and, where applicable, the camouflage material can be made using suitable pigments and dyes known to the skilled person.

It is also possible to incorporate pigments or dyes into a material used in the non-energy-generating part of the solar cell unit. A more particular embodiment of this is the incorporation of pigments or dyes into the conductive paste which is used in applying the grid and/or into the conductive or insulating pastes used in the monolithic series connection. In this way the application of color or camouflage can be incorporated very easily into the manufacture of the solar cell unit. However, since pigments are generally non-conductive, the conductivity of the conductive paste will be affected by the presence of pigments therein. The application of color or camouflage via a separate layer is therefore preferred at this point in time.

The invention can be used with solar cell units manufactured by means of a batch process, e.g., solar cell units on rigid glass carriers. Alternatively, the invention can be used with solar cell units manufactured by means of a continuous process, more particularly, with flexible thin film solar cell units made in a roll-to-roll process, e.g., as described in WO 98/13882 or WO 99/49483, which publications are hereby incorporated by reference as regards the process for manufacturing the flexible solar cell units and the materials used in said units.

The coloring material and, where applicable, the camouflage material can be applied on the solar cell unit in a separate production step, but the application can also be integrated into the manufacture of the solar cell unit. Since the locations where the coloring material and, where applicable, the camouflage material are to be provided require accurate determination, it is generally preferred to integrate the application of the coloring material and where applicable the camouflage material into the manufacture of the solar cell unit.

The manner in which the monolithic series connection is established in thin film solar cell units is not critical to the present invention. Many suitable methods are known to the skilled person. Thus it is possible to first provide a complete solar cell unit comprising a front electrode, a photovoltaic layer, and a back electrode on a carrier and then to divide the material into individual cells and establish a series connection. Alternatively, the different steps of dividing into individual cells and establishing the series connection can be integrated into the manufacture of the solar cell unit. Thus it is possible to first apply the back electrode on a carrier, divide the back electrode by providing grooves, e.g., with the aid of a laser, apply a photovoltaic layer, divide the photovoltaic layer by providing grooves or rows of holes adjacent to the grooves in the back electrode, apply the front electrode, and divide the front electrode into grooves with the aid of, e.g., a laser, adjacent to the division in the photovoltaic layer. In this way a series connection is established. Alternatively, the division can be made by applying certain layers while employing a mask.

As indicated above, a solar cell unit comprises a back electrode, a photovoltaic layer, and a front electrode, and frequently a carrier as well. The nature of the carrier, the back electrode, the photovoltaic layer, and the front electrode is not critical to the present invention. The following description serves merely for illustrative purposes.

The carrier, if present, may be any known carrier. When the carrier is present on the side of the front electrode, it should be transparent to the relevant part of the solar spectrum. The carrier may be made of, e.g., glass or of a transparent polymer. When the carrier is situated on the side of the back electrode, it may be transparent or not, depending on the envisaged use of the solar cell unit. Suitable materials include rigid materials such as glass and flexible materials which are suitable for use in roll-to-roll processes, such as polymer films or metal foils.

The front electrode will generally be a transparent conductive oxide (TCO). Suitable TCOs include indium tin oxide, zinc oxide, aluminium-, fluorine- or boron-doped zinc oxide, cadmium sulfide, cadmium oxide, tin oxide, and F-doped $SnO_2$.

The photovoltaic layer may comprise every suitable system known to the skilled person, e.g., amorphous silicon (a-Si:H), microcrystalline silicon, polycrystalline silicon, amorphous silicon carbide (a-SiC) and a-SiC:H, amorphous silicon-germanium (a-SiGe) and a-SiGe:H, a-SiSn:H, CIS (copper indium diselenide, $CuInSe_2$), cadmium telluride, Cu(In,Ga)Se, ZnSe/CIS, ZnO/CIS, Mo/CIS/CdS/ZnO, and dye-sensitized cells. Also, multi-junction cells of the aforesaid materials may be used.

The back electrode, which depending on the use of the solar cell unit may also serve as a reflector, may be composed of, e.g., aluminium, silver, molybdenum, or a combination thereof, optionally with an intermediate layer of a dielectric material such as ZnO between about the metal layer and the photo-active semiconductor. In (semi)transparent solar cell units a TCO as described for the front electrode is used in the back electrode.

If so desired, the solar cell unit may comprise additional known components such as encapsulants to protect the unit from environmental effects.

The invention claimed is:

1. A solar cell unit, comprising:
   a back electrode,
   a photovoltaic (PV) layer, and,
   optionally, a front electrode, with part of the surface of the solar cell unit not generating energy, wherein part of the non-energy-generating part of the solar cell unit is provided with a coloring material and part of the non-energy-generating part of the solar cell unit is provided with a camouflage material, while at least part of the energy-generating part of the solar cell unit is free of a coloring material, the coloring material and the camouflage material having different colors, the color of the coloring material being selected such that the dEab between the part of the solar cell unit provided with a coloring material and the energy-generating part of the solar cell unit is at least about 10 and the color of the camouflage material being adapted to that of the energy-generating part of the solar cell unit.

2. The solar cell unit of claim 1 wherein the dEab between the part of the solar cell unit provided with a coloring material and the energy-generating part of the solar cell unit is at least about 12.

3. The solar cell unit of claim 2 wherein the dEab between the part of the solar cell unit provided with a coloring material and the energy-generating part of the solar cell unit is between about 20 and 100.

4. The solar cell unit of claim 1 wherein the color of the camouflage material is selected such that the dEab between the part of the solar cell unit provided with a camouflage material and the energy-generating part of the solar cell unit is below about 5.

5. The solar cell unit of claim 4 wherein the color of the camouflage material is selected such that the dEab between the part of the solar cell unit provided with a camouflage material and the energy-generating part of the solar cell unit is below about 2.

6. The solar cell unit of claim 5 wherein the color of the camouflage material is selected such that the dEab between the part of the solar cell unit provided with a camouflage material and the energy-generating part of the solar cell unit is below about 0.3.

7. The solar cell unit of claim 1 wherein at least 20% of the non-energy-generating part of the solar cell unit is provided with either a coloring or a camouflage material.

8. The solar cell unit of claim 7 wherein at least 50% of the non-energy-generating part of the solar cell unit is provided with either a coloring or a camouflage material.

9. The solar cell unit of claim 8 wherein at least 80% of the non-energy-generating part of the solar cell unit is provided with either a coloring or a camouflage material.

10. The solar cell unit of claim 9 wherein substantially all of the non-energy-generating part of the solar cell unit is provided with either a coloring or a camouflage material.

11. The solar cell unit of claim 1 wherein 10-90% of the non-energy generating part of the solar cell unit is provided with a coloring material and 10-90% of the non-energy generating part of the solar cell unit is provided with a camouflage material.

12. The solar cell unit of claim 1 wherein the energy-generating part of the solar cell unit is essentially free of a coloring material.

13. The solar cell unit of claim 1 wherein the solar cell unit is provided with a grid, with at least part of the grid being provided with a coloring material.

14. The solar cell unit of claim 1 wherein the solar cell unit is a thin film solar cell unit which comprises individual cells having a monolithic series connection, where at least part of the non-energy-generating part of the solar cell unit resulting from the series connection is provided with a coloring material.

15. The solar cell unit of claim 1 wherein the coloring material comprises two or more colors.

16. A process for manufacturing the colored solar cell unit of claim 1 wherein a solar cell unit comprising a back electrode, a photovoltaic (PV) layer, and, optionally, a front electrode, with part of the surface of the solar cell unit not generating any energy, is provided with a coloring material and a camouflage material on at least part of the non-energy-generating part of the solar cell unit, while at least part of the energy-generating part of the solar cell unit is kept free of a coloring material.

17. The process of claim 16 wherein the coloring material and/or where applicable the camouflage material is applied by means of a printing technique.

18. The process of claim 17 wherein the application of the coloring material and/or where applicable the camouflage material is carried out in a roll-to-roll process.

19. The process of claim 16 wherein the application of the coloring material and/or where applicable the camouflage material is carried out in a roll-to-roll process.

* * * * *